United States Patent
Guggenbühl et al.

(10) Patent No.: US 6,600,380 B1
(45) Date of Patent: Jul. 29, 2003

(54) METHOD AND DEVICE FOR MEASURING THE DAMPING OF AN LC-OSCILLATING CIRCUIT

(75) Inventors: Walter Guggenbühl, Stäfa (CH); Benjamin Hug, Bülach (CH); Daniel Brändle, Amriswil (CH)

(73) Assignee: Baumer Electric AG, Frauenfeld (CH)

( * ) Notice: Subject to any disclaimer, the term of this patent is extended or adjusted under 35 U.S.C. 154(b) by 0 days.

(21) Appl. No.: 09/857,641

(22) PCT Filed: Dec. 8, 1999

(86) PCT No.: PCT/CH99/00593

§ 371 (c)(1),
(2), (4) Date: Aug. 20, 2001

(87) PCT Pub. No.: WO00/35092

PCT Pub. Date: Jun. 15, 2000

(30) Foreign Application Priority Data

Dec. 8, 1998 (CH) .................................... 2432/98

(51) Int. Cl.⁷ ..................... G01N 27/00; G08B 19/00; G08B 21/00; G08B 23/00
(52) U.S. Cl. ..................... 331/117 R; 331/117 FE; 331/108 C; 331/65
(58) Field of Search .................. 331/117 R, 117 FE, 331/117 D, 167, 65, 108 C; 324/326, 207.16

(56) References Cited

U.S. PATENT DOCUMENTS

| | | | |
|---|---|---|---|
| 4,001,718 A | * | 1/1977 | Wilson et al. ........... 324/207.16 |
| 4,543,527 A | * | 9/1985 | Schuchmann et al. .. 324/207.26 |
| 4,644,298 A | * | 2/1987 | Kamiya et al. ............. 324/236 |
| 4,761,603 A | * | 8/1988 | Nodera ....................... 323/315 |
| 4,803,444 A | * | 2/1989 | Takahashi ................... 324/236 |
| 4,879,512 A | * | 11/1989 | Leonard et al. ........ 324/207.16 |
| 5,767,672 A | | 6/1998 | Guichard et al. ........... 324/236 |

OTHER PUBLICATIONS

Tietze U. et al.; *FET–Differenzverstaerker*; pp. 97–99.

* cited by examiner

Primary Examiner—Tuan T. Lam
(74) Attorney, Agent, or Firm—Pearne & Gordon LLP

(57) ABSTRACT

A known oscillator with a 2-terminal coil without a tapping has only a limited dynamic controllability and apart from this is unsuitable for implementation in CMOS technology. The oscillator, first of all is extended by a current mirror. By the addition of the current mirror Q3, Q4 and additional power supply sources, one achieves a greater dynamic controllability and the suitability for implementing it in CMOS technology. By means of the excitation of the oscillating circuit with switched current sources Io, one achieves the proportionality of the oscillation amplitude to Rp and Io. In practice more complicated structures are used for switches and current sources. With this, an additional controllability of the oscillation amplitude independent of the damping of the oscillating circuit is obtained. The method is-used for distance measurement. The additional control of the oscillation amplitude is utilized for the correction of the manufacturing tolerances and of the temperature-dependence.

12 Claims, 3 Drawing Sheets

METHOD AND DEVICE FOR MEASURING THE DAMPING OF AN LC-OSCILLATING CIRCUIT

FIELD OF THE INVENTION

This invention concerns a method for the measurement of the equivalent damping resistance of a LC resonant circuit and its application to devices which measure the distance to an electrically conductive object based on changing losses in the LC-resonant circuit with varying measuring distance, specifically proximity switches.

BACKGROUND OF THE INVENTION

Numerous technical measuring methods are based on the determination of the damping of LC resonant circuits. The precise measurement and control of the equivalent damping resistance of this sensing circuit type is therefore a central problem of many electronic devices. In the following a device for the determination of the distance relative to an electrically conductive object (target) on the basis of the damping of a LC resonant circuit is used for the illustration of the new method and as an example for a circuit implementation of the present invention. Devices based on the damping of a LC resonator are widely used in industry, specifically as proximity switches.

The accuracy with respect to the measuring or switching distance, resp. of such devices is determined to a great extent by the circuit principle utilized for the excitation of LC resonant circuit. Generally a distance dependent direct current or oscillation voltage value is formed and, in the case of a proximity switch, is used for controlling a switch. In doing so, a principal problem is the temperature-constancy of the switching point and its dependence on the tolerances of the circuit components utilized and of the housing installation, which calls for a compensation after the completion of the manufacturing.

For reasons of cost, the choice among the many and diverse known oscillator structures and the possibility of compensation after the manufacturing (e.g., by means of laser trimming) is limited.

In general, the core of an oscillating circuit with a LC resonant circuit is formed by a feedback amplifier. If the feedback is "in phase" and if the circuit amplification is greater than one, then the circuit oscillates with a frequency defined by the LC resonant circuit. The amplitude of the oscillation generated in the case of simple oscillators, apart from a dependence on the LC resonant circuit damping, is above all defined by a so-called non-linearity, e.g., inasmuch as the limit of the dynamic control range is reached, which renders a further increase of the oscillation voltage impossible. By this saturation level dependent on the circuit damping, the working point currents of the circuit are changed; this change can be utilized as a measure for the oscillating circuit damping and therefore as a measure for the distance.

As an alternative to this method, the controlling of an oscillation amplitude to a fixed value by means of a linear controlling of the amplification factor of the excitation amplifier presents itself, wherein the control value is a measure for the damping of the oscillating circuit.

Types of circuit of this kind, however, are only to a very limited extent suitable for fulfilling the combined characteristics listed above, for the following reasons:

The derivation of the distance information from a more or less undefined mixture of oscillating circuit damping and oscillating range saturation, as takes place in simple oscillators, because it can only be theoretically described with difficulty, is not suitable for highly accurate and digitally trimmable oscillators;

The method with a controlled oscillation amplitude manifests a too great inertia (in the case of moving measuring heads). Equally the exploitation of the commencement of the oscillation as a proximity switching criterion has to be eliminated for reasons of speed.

SUMMARY OF THE INVENTION

The invention therefore sets itself the objective of creating a circuit structure, with which the requirements mentioned above are fulfilled and which overcomes the disadvantages of the alternative methods.

The improved method in accordance with the invention is based on a novel oscillator concept, which provides the possibility for fulfilling in combination the following characteristics:

Basic excitation circuit of the LC resonant circuit which generates an oscillation voltage proportional to the damping resistance of the LC resonant circuit and which is controllable by the exiting circuit in a well-defined manner.

Compensation of the temperature-dependence of the LC-resonant circuit adjustable independent of the basic circuit.

"Electronic" compensation of the manufacturing tolerances after completion of the manufacture.

2-terminal oscillator (no middle tappings on the coil).

Monochip-integration of all the functions.

The present invention is based on an oscillation circuit which uses the LC resonant circuit in combination with an excitation circuit whose performance is controlled by one single resistor connected to the exciting circuit. This feature makes it suitable for monochip integration. Using this oscillation circuit in connection with an inductive sensor probe for proximity switches, the switching distance is adjusted by the distinguished resistor mentioned above. According to special embodiments, additional means are provided for the temperature compensation and "electronic" trimming of the device.

The requirement for a 2-terminal coil without a middle tapping can be fulfilled by a two-stage excitation amplifier. Circuits of this kind have been suggested in the literature. These circuits, however, only have a limited dynamic controllability and apart from this are not suitable for CMOS technology. In order to circumvent this disadvantage, one can in accordance with the invention extend circuit types of this kind, as is explained below in detail in connection with the discussion of the Figures.

DESCRIPTION OF THE PREFERRED EMBODIMENTS

Figure 1:
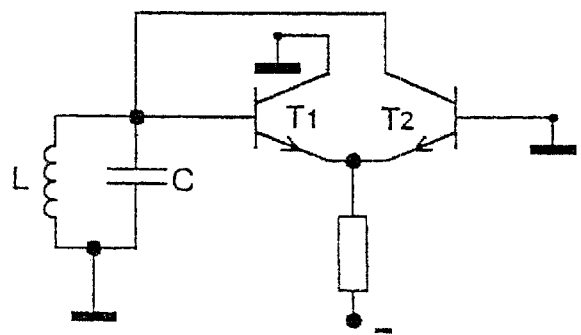
FIG. 1 shows a known circuit.

FIG. 1 illustrates a prior art oscillating circuit with only two wires connecting the LC resonant circuit with the exciting circuit part, the latter consisting of a two-stage amplifier formed by the transistors T1 and T2 (in accordance with U. Tietze, Ch. Schenk, Semiconductor Circuit Technology, Springer, fifth edition, page 425). This circuit has only a limited dynamic controllability and as such would not fulfill the purpose strived for. Furthermore it is not adapted to CMOS technology in this form.

Figure 2:
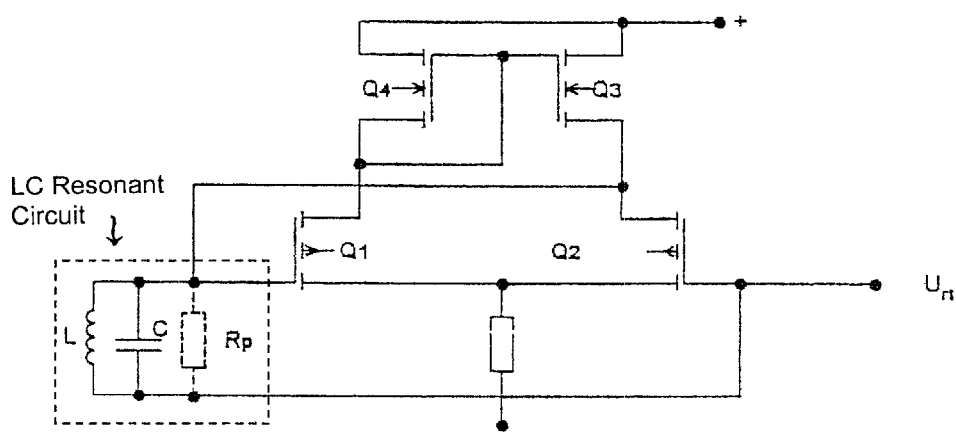
FIG. 2 depicts a first step of an improvement of the circuit FIG. 1 in accordance with the invention.

A first step towards the present invention is illustrated in FIG. 2. By the addition of the current mirror Q3, Q4 one achieves a greater dynamic controllability and through the utilization of MOS transistors in the suitability for an implementation in CMOS technology. Q1 and Q2 replace the transistors T1 and T2 of FIG. 1. In FIG. 2 the equivalent damping resistance of the LC-resonant circuit is represented by the resistor $R_p$. In practice, the damping resistance is caused by the presence of an electrically conductive object placed in the range of action of a magnetic field of the coil.

Figure 3:
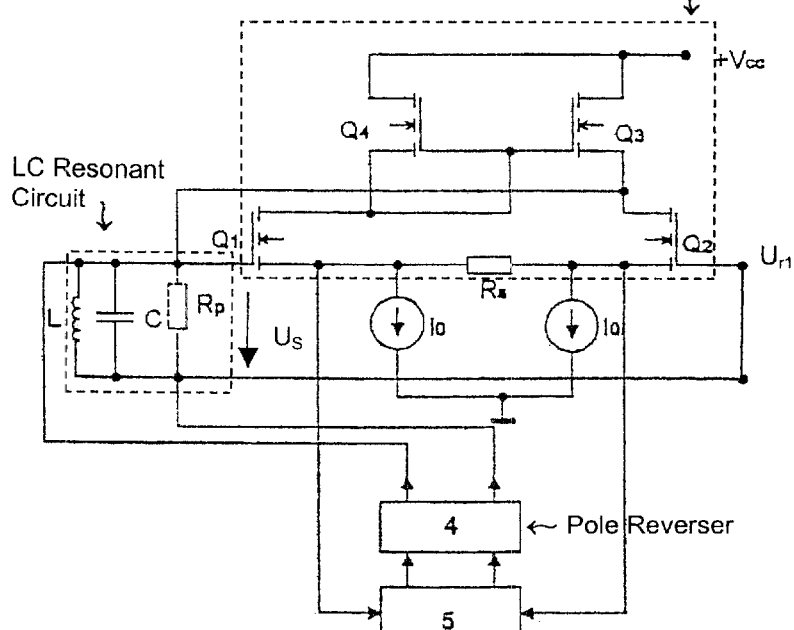
FIG. 3 illustrates a further improvement of the basic circuit of FIG. 2 using a so-called oscillator core in accordance with the present invention.

FIG. 3 illustrates further steps towards the present invention. The LC resonant circuit, represented by inductance L, capacitance C and (equivalent) damping resistance Rp, is excited by a circuit similar to FIG. 2, but with the tail resistor of FIG. 2 replaced by two control current sources $I_0$ interconnected by a resistor Rs. By suitable choice of the value of Rs, this modified circuit is capable of oscillation over a wide range of the equivalent damping resistance Rp. This-.exciting circuit generates a square-wave-current with zero dc-content and a peak amplitude proportional to the currents $I_0$. This square wave current flows across the LC resonant circuit. Since this circuit acts as a bandpass filter, the result is a harmonic oscillation voltage ($u_s$) across the LC resonant circuit terminals, the amplitude of $u_s$ being proportional to the reference current $I_0$ supplied to the excitation circuit and the damping resistance $R_p$ of the LC resonant circuit.

FIG. 3 further illustrates an extension of this oscillating circuit by which the oscillation voltage $u_s$ can be controlled. By feeding the supplementary dc control current $I_k$ to a chopper 5 which is driven by the oscillation voltage and followed by a programmable pole reverser (phase inverter) 4 an additional square wave current component is fed to the LC resonant circuit generating a corresponding contribution to the oscillation voltage $u_s$. The circuit blocks 4 and 5 are described in more detail referring to FIGS. 6 and 7.

For reasons of simplicity, in FIG. 3 for the switches only simple transistors are depicted and the controllable currents Io are indicated by corresponding source signals. In practice, the MOS-transistors are replaced by more complicated structures, e.g., comprising compound transistors. The current sources may be implemented by means of cascodes.

The method according to the invention, which is also discussed referring to the shown circuits, is based on the excitation of an oscillating circuit with a square-wave current, or with currents, respectively the value of which is determined by the direct currents fed into the circuit. As a result, an oscillating voltage is generated, which is proportional to the value of the currents and to the effective damping resistance of the oscillating circuit, because the oscillating circuit filters out the fundamental harmonic oscillation from the excitation currents.

A correction of the contribution of the effective damping resistance (e.g. necessary for the compensation of the coil manufacturing tolerances) can be achieved by an appropriate changing of the control currents fed in. On achieves this by means of additional currents to the direct current fed in.

For example, suitable additional partial currents may be added to the main current Io. In our preferred embodiment, an additional control current $I_k$ is chopped by means of a chopper and is fed directly into the LC resonant circuit in the suitable phase position (for example, through a pole reverser).

The controlling of the effective damping resistance can be achieved by the changing of the control currents-fed in. One achieves this by means of additional currents to the direct current fed in.

For example, suitable additional currents are added to the main current for controlling, or in a further, preferred embodiment the additional currents are chopped by means of a chopper and are fed into the oscillating circuit in the suitable phase position (for example, through a pole reverser).

By means of an appropriate selection of the phase position, positive and negative corrections can be achieved.

The circuit blocks 4/5 are described in more detail in connection with FIGS. 6 and 7.

Figure 4:
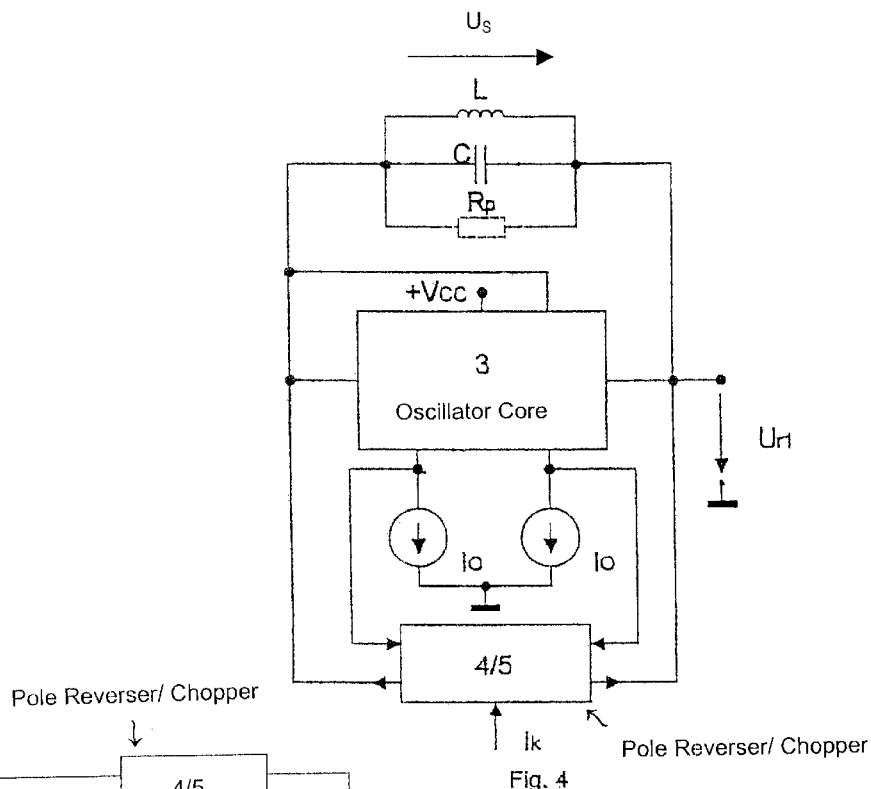
FIG. 4 shows a simplified version of FIG. 3 using appropriate sub-circuit blocks.

FIG. 4 illustrates a condensed representation of the circuit described in FIG. 3 with the help of a sub-circuit named oscillator core 3. The oscillator core comprises the basic exciting circuit components in accordance with FIG. 3 without the control current sources $I_0$.

The basic part of the oscillation voltage amplitude ($u_s$) is still generated by the oscillator core and is proportional to the damping resistance Rp of the LC resonant circuit and the control current $I_0$. A supplementary portion of the oscillation voltage $u_s$ is produced by the circuit-block 4/5 (a combination of the blocks 4 and 5 in FIG. 3) proportional to the damping resistance Rp and the additional control current $f_k$.

Figure 5:
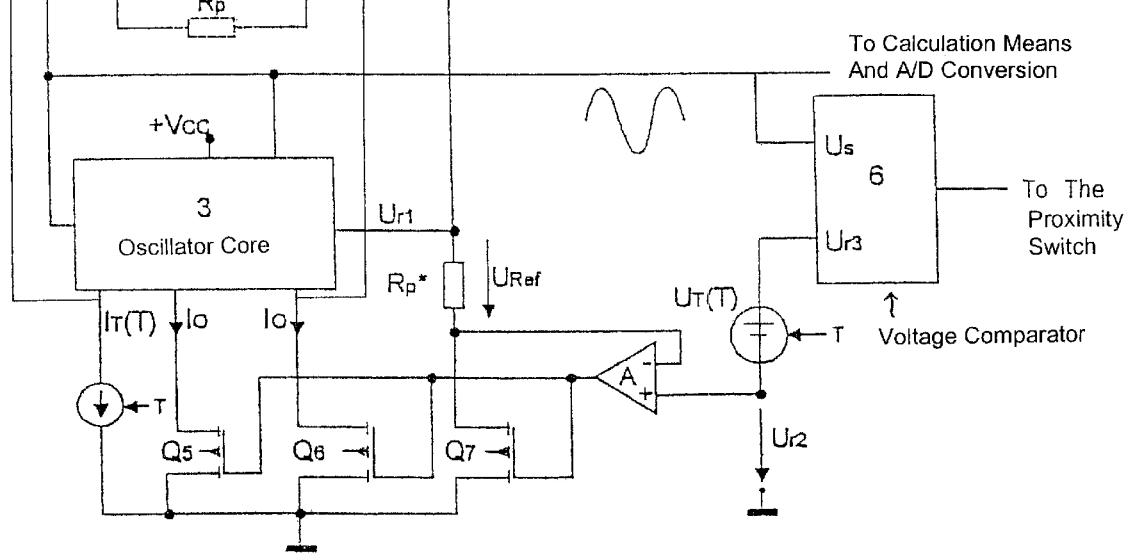
FIG. 5 illustrates a completion of the current controlled oscillating circuit in accordance with the present invention.

FIG. 5 finally depicts the structure of a complete circuit operating on the basis of the present patent application for the measurement of the equivalent damping resistance of the LC resonant circuit, and illustrates its application as a proximity switch. Compared to FIG. 4, FIG. 5 contains an additional circuit part which generates the control currents $I_0$ proportional to a reference current $I_{REF}$ by means of current mirrors, wherein the reference current $I_{REF}$ is produced by a reference voltage $U_{REF}$ and a shunting resistor $R_p^*$. With the aid of additional current mirrors (not shown in FIG. 5) supplementary control current components, e.g. currents $I_k$ of sub-circuit 4/5, can be derived from $I_{REF}$ as well.

As a consequence, the oscillation voltage $u_s$ in FIG. 5 is proportional to $I_{REF}$. In the circuit of FIG. 5, the reference voltage $U_{REF}$ equals the difference of two bias voltages $U_{REF}=U_{r1}-U_{r2}$. By the derivation of the current $I_0$ through said shunting resistor from the reference voltage source $U_{REF}=U_{r1}-U_{r2}$, $I_{REF}$ and therefore the oscillation amplitude $u_s$ follows any changes of $U_{REF}$.

In the case of the utilization as a proximity switch, the oscillating.circuit amplitude is compared with a reference value $U_{REF}$ and the result (the difference, resp., the polarity) is utilized for the actuation of an electric or electronic switch. In the device in accordance with the invention, the voltage reference value $U_{REF}$ is maintained constant and the desired switching point is reached by adapting the shunting resistor $R_p^*$. The voltage comparison with this becomes independent of the absolute value of $U_{REF}$.

The complete circuit FIG. 5 further contains a voltage comparator (6) which compares the amplitude of the oscillating voltage $u_s$ with the reference voltage $U_{REF}$. As a result of the current relations explained above, the oscillation voltage $u_s$ follows changes of $U_{REF}$, thus making the amplitude comparison independent of absolute value of $U_{REF}$. As mentioned above, the oscillation voltage $u_s$ is proportional to $I_{REF}$ and $R_p$.

In case of the application of this method in a device for the measurement of the distance from an electrically conductive object (target) the oscillation voltage $u_s$ can be used as distance information for further processing. As mentioned above, in case of the application as a proximity switch the output of the comparator (6) drives an electrical or electronic switch. The switching point can be set by an appropriate value of the resistor $R_p^*$.

FIG. 5 further illustrates means for the correction of changes of the distance information (represented by $u_s$) or switching point resp. due to changes of the operation temperature T. Appropriate temperature dependent circuit components like thermistors can be used for the generation of a temperature dependent voltage source $U_T$ connected in series to one of the comparator inputs or, alternatively a temperature dependent control current portion $I_T$.

The sub-circuit (4/5) contains means for digital adjustment, i.e. the programmed generation of supplementary control currents. An example for the use of these currents is the final trimming of proximity switches at the end of the manufacturing process. More details of this process are described in connection with FIGS. 6 and 7.

Generation of a switching hysteresis is another example for efficient use of a small supplementary control current. This is illustrated in FIG. 7 by the partial current $I_z$ which is switched into the chopper depending on the state of the output switch.

Figure 6:
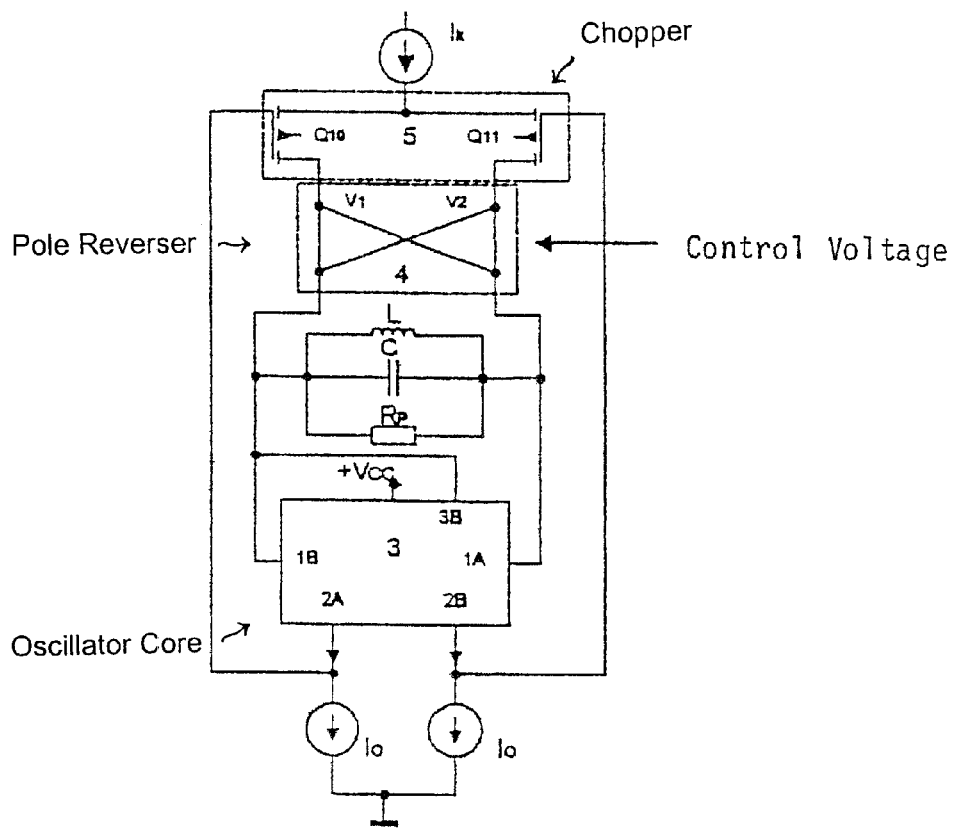
FIG. 6 depicts the details of the special function blocks used for "trimming" and compensation of the oscillating circuit.

FIG. 6 depicts the transformation of a partial control current ($I_k$) into a corresponding square-wave exciting current supplied to the resonant LC circuit.

In the chopper 5, formed by the MOS-transistors Q10 and Q11, the partial control current $I^k$ is chopped by the oscillating signal. The pole reverser 4 contains phase inverter which determines the polarity of the corresponding exciting current (i.e. the sign of the corresponding correction of the switching point) according to a control voltage applied to block 4.

Most concretely, in the embodiment shown, the programmable pole reverser 4 exchanges the two connections V1, V2 of the chopper 5 formed with the MOS-transistors Q10, Q11 with.the control voltage to the LC-resonant circuit according to the control voltage which defines the sign of the correction. With 1A, 1B, 2A, 2B and 3B, the inputs of the oscillator core derived by means of the Figures discussed previously are designated.

In an expansion of the concept in accordance with the invention, the goal for "digital" compensation of the tolerances is realized by a complete set of current sources of this type with binary weighting, which are controlled by a programmable constant value memory. In this, only the most highly weighted bits are explicitly implemented as corresponding current sources; the lowest bit weightings are formed by means of a pulse density modulator (wherein the oscillating circuit takes care of the required subsequent averaging of the oscillation amplitude).

Figure 7:
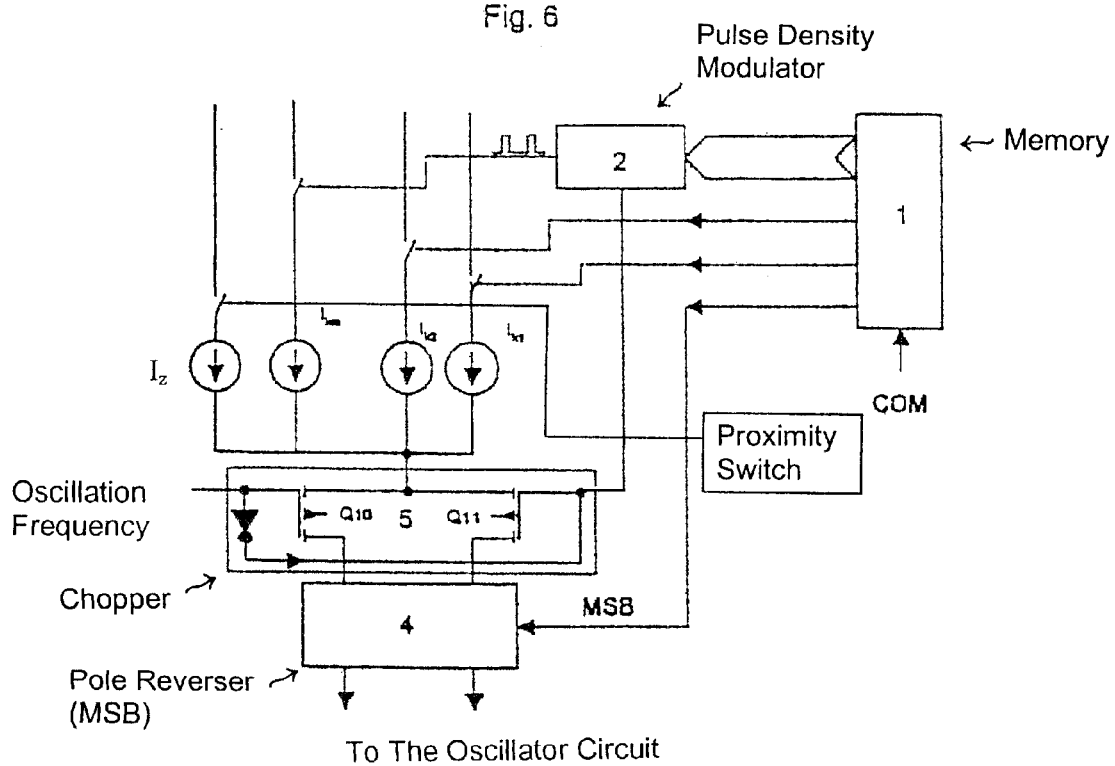
FIG. 7 illustrates an example for the programmed generation of a corrective current by means of a current mode D/A converter.

FIG. 7 depicts programming means for a partial control current using a current mode D/A converter. A digital control word is stored in a-constant value memory 1 (i.e. ROM, EPROM, EEPROM etc.). The most significant bit (MSB), which is connected as a control voltage to the pole reverser 4, determined the polarity of the resulting additional exciting current. The next significant bits switch binary weighted current sources $I_{k1}, I_{k2} \ldots$ ). The lowest significant bits are converted into a corresponding average output current ($I_{km}$) by means of a pulse density modulator 2. The sum of these currents is chopped 5 and phase inverted according to the MSB 4. Fluctuating resulting from the averaging of the current contributions of the pulse density modulator in the amplitude comparison following the signal changing in function of the time are eliminated by an additional filter after the switched comparator 6.

A known serial/parallel interface is provided for the constant value memory.

This mixed form of the D/A conversion for the generation of the correction current has been selected for the shown embodiment; however, also any other form of static D/A converter is usable.

The implementation of a switching hysteresis can take place with the help of a small, adjustable additional current $I_z$. For this purpose, this current, dependent on the position of the output—(proximity—) switch, is switched in or—out in such a manner, that the switching point in the sense of a hysteresis becomes dependent on the direction of the damping change. By means of a programming of the current value as from the internal constant value memory or by wiring a pin, into the circuit, the width of the hysteresis can be adjusted during the completion of the circuit.

The n- and p-channel transistors in FIGS. 2 to 7 can be interchanged with the corresponding reversing of the polarity of the power supply source.

What is claimed is:

1. A method for the measurement of the damping of an LC-resonant circuit, comprising the steps of:
    generating a reference current ($I_{REF}$) by applying a reference voltage ($U_{REF}$) across a shunting resistor ($R_p^*$),
    connecting the LC resonant circuit with an exciting circuit to form an electronic oscillating circuit, the exciting circuit (3) being supplied with a DC control current, which is proportional to said reference current, thereby generating an oscillation voltage ($u_s$) across the LC-resonant circuit, the oscillation voltage being proportional to said control current and an equivalent damping resistance ($R_p$) of the LC-resonant circuit, and
    altering the reference current ($I_{REF}$) by variation of the shunting resistance ($R_p^*$) in such a manner, that the amplitude of said oscillation voltage ($u_s$) is equal to the reference voltage ($U_{REF}$), said shunting resistor ($R_p^*$) then being a measure for the equivalent damping resistance ($R_p$).

2. The method in accordance with claim 1, wherein the DC control current is the sum of several partial currents comprising a fixed basic portion ($I_0$) and a set of additional partial currents ($I_{k1}, I_{k2} \ldots, I_{km}$), which all are proportional to said reference current ($I_{REF}$), the additional partial currents being switchable into—or out of the oscillating circuit thereby producing a supplementary component of the oscillation voltage ($u_s$).

3. A device for the measurement of the distance from an electrically conductive object by measurement of the equivalent damping of a LC-resonant circuit, comprising:
    an exciting circuit (3) connected to the LC resonant circuit, the exciting circuit being designed to form an oscillating circuit for the generation of an oscillation voltage ($u_s$) in the attached LC resonant circuit, the oscillation voltage being proportional to an equivalent damping resistance $R_p$ of the LC-resonant circuit and to a DC control current supplied to the exciting circuit (3), means for the generation of said control current, which is proportional to a reference current ($I_{REF}$), said reference current being generated by means of a fixed reference voltage ($U_{REF}$) applied to a shunting resistance ($R_p^*$), which is connected to the oscillating circuit, and a comparator (6) in which said oscillation voltage is compared with the reference voltage ($U_{REF}$), an output of the comparator (6) driving an electric or electronic switch so that a switching point is adjustable to a predefined object distance by adjusting the shunting resistance ($R_p^*$).

4. The device in accordance with claim 3, wherein the DC control current is the sum of a fixed basic portion ($I_0$) and one or several additional partial control currents, the device comprising additional means (4, 5) for the generation of said one or several additional partial control currents ($I_{k1}$, $I^{k2}$ . . . ) which are proportional to the reference current ($I_{REF}$) and are operable for modifying the oscillation voltage.

5. Device in accordance with claim 4, comprising: means by which one of the additional control currents ($I_k$) is an input current of a current mode D/A converter by which the digital value stored in a constant value memory (COM) is converted into a set of weighted control current components, used for correction of errors of the switching point of the distance measuring device, these errors being the result of component and manufacturing tolerances, wherein the constant value memory is programmable through a serial interface during a final check after assembly of the distance measuring device.

6. The device in accordance with claim 5, wherein the most significant bit of the constant value memory (1) drives a pole reverser (4), the next significant bits controlling correspondingly binary weighted DC current sources of additional partial currents ($I_{kn}$), the lowest significant bits being converted into a corresponding average output current ($I_{km}$) by means of a pulse density modulator (2), and the sum of all output currents being chopped by the oscillating voltage and supplied to the LC resonant circuit through the pole reverser (4).

7. The device in accordance with claim 3, further comprising means for the generating of an additional temperature compensation control current source ($I_T$) appropriately varying with operating temperature (T), by which the temperature dependence of the switching point can be compensated.

8. The device in accordance with claim 3, further comprising a temperature compensation voltage source $U_T(T)$ in series with one input of the comparator, for the temperature-compensation of the switching point.

9. The device in accordance with claim 3, wherein all functional components, with the exception of the LC resonant circuit and the shunting resistor $R_p^*$, are integrated on one single chip.

10. The device in accordance with claim 3, wherein the oscillation voltage is made available as distance information on a terminal (D) for additional calculations and A/D conversion.

11. The device in accordance with claim 3, further comprising means for the implementation of a switching hysteresis, by an additional control current component ($I_z$), switchable into a chopping circuit (5) dependent on a position of an output proximity switch.

12. An excitation circuit for an electric LC resonant circuit with means for the measurement of an equivalent damping resistance of this LC resonant circuit comprising:

means for the generation of a reference current ($I_{REF}$) by a fixed reference voltage ($U_{REF}$) applied to a shunting resistor ($R_p^*$), said resistor being connected to two circuit terminals, means for the generation of an oscillation voltage ($u_s$) across the LC resonant circuit, which oscillation voltage is proportional to the equivalent damping resistance ($R_p$) of the resonant circuit and proportional to a control current supplied to the excitation circuit, said control current being proportional to the reference current ($I_{REF}$), and a comparator which is operable to compare the amplitude of the oscillation voltage ($u_s$) with the reference voltage ($U_{REF}$).

* * * * *

UNITED STATES PATENT AND TRADEMARK OFFICE
CERTIFICATE OF CORRECTION

PATENT NO. : 6,600,380 B1
DATED : July 29, 2003
INVENTOR(S) : Walter Guggenbühl et al.

It is certified that error appears in the above-identified patent and that said Letters Patent is hereby corrected as shown below:

Title page, Item [54] and Column 1, lines 1-3,
Title, please delete "METHOD AND DEVICE FOR MEASURING THE DAMPING OF AN LC-OSCILLATING CIRCUIT", and insert therefor
-- METHOD AND DEVICE FOR MEASURING THE DAMPING OF A LC RESONANT CIRCUIT --.

Title page,
Item [57], ABSTRACT,
Line 15, please delete "is-used", and insert therefor -- is used --.

Column 3,
Lines 36-37, please delete "This-.exciting", and insert therefor -- This exciting --.

Column 4,
Line 16, please delete "currents-fed", and insert therefor -- currents fed --.
Line 40, please delete "$f_k$", and insert therefor -- $I_k$ --.
Line 61, please delete "oscillating.circuit", and insert therefor -- oscillating circuit --.

Column 5,
Line 43, please delete "$I^k$", and insert therefor -- $I_k$ --.
Line 52, please delete "with.the", and insert -- with the --.

Column 6,
Line 3, please delete "a-constant", and insert therefor -- a constant --.

Column 7,
Line 22, please delete "$I^{k2}$", and insert therefor -- $I_{k2}$ --.

Signed and Sealed this

Thirtieth Day of December, 2003

JAMES E. ROGAN
*Director of the United States Patent and Trademark Office*